United States Patent [19]

Pusch

[11] Patent Number: 5,186,638
[45] Date of Patent: Feb. 16, 1993

[54] TRANSPORTATION PROTECTION AND INSERTION DEVICE FOR MULTI-CONDUCTOR CABLES

[75] Inventor: Reinhard Pusch, Rodgau, Fed. Rep. of Germany

[73] Assignee: Thomas & Betts Corporation, Bridgewater, N.J.

[21] Appl. No.: 752,717

[22] Filed: Aug. 30, 1991

[30] Foreign Application Priority Data

Sep. 5, 1990 [DE] Fed. Rep. of Germany ....... 4028135

[51] Int. Cl.5 ...................... H01R 13/40; H01R 13/44
[52] U.S. Cl. ..................................... 439/140; 29/842; 29/845; 206/328; 206/331; 439/141; 439/377; 439/493; 439/892
[58] Field of Search .................. 29/842, 845; 206/328, 206/330, 331; 439/77, 140, 141, 367, 377, 493, 495, 499, 502, 629, 892, 893

[56] References Cited

U.S. PATENT DOCUMENTS

| | | | |
|---|---|---|---|
| 3,251,020 | 5/1966 | Coleman | 439/892 |
| 3,855,567 | 12/1974 | Harms et al. | 339/61 M |
| 4,139,727 | 2/1979 | Kuballa | 174/68.5 |
| 4,197,945 | 4/1980 | Sherwood | 439/892 |
| 4,817,795 | 4/1989 | Kos | 206/328 |
| 4,913,662 | 4/1990 | Noy | 439/498 |
| 4,946,395 | 8/1990 | Cope et al. | 439/352 |
| 4,955,814 | 9/1990 | Christie et al. | 439/493 |
| 5,015,946 | 5/1991 | Janko | 439/140 |

FOREIGN PATENT DOCUMENTS

| | | |
|---|---|---|
| 1163336 | 3/1984 | Canada . |
| 0384591 | 8/1990 | European Pat. Off. . |
| 2545791 | 5/1976 | Fed. Rep. of Germany . |
| 7733553 | 7/1978 | Fed. Rep. of Germany . |
| 3004072 | 8/1981 | Fed. Rep. of Germany ...... 439/377 |
| 3405126 | 8/1985 | Fed. Rep. of Germany ...... 439/493 |
| 20056 | of 1974 | Japan . |
| 150349 | of 1974 | Japan . |
| 70757 | of 1976 | Japan . |
| 2095923 | 10/1982 | United Kingdom ................ 206/331 |

Primary Examiner—Paula A. Bradley
Attorney, Agent, or Firm—Robert M. Rodrick; Salvatore J. Abbruzzese

[57] ABSTRACT

For the purposes of connecting and joining conductive traces on printed circuit boards, the stripped ends of a flexible multi-conductor flat cable are inserted into metallized openings in the printed circuit boards. The cables are cut to length and their ends are stripped of insulation and supported in an injection molded bar member. Those ends are desirably not to be bent in storage and transportation. In order to protect them, a U-shaped device is pushed onto the bar member over the cable ends. The bottom plate portion of the device has holes of a conical configuration. In a transportation position the ends are disposed within the walls of those holes and are held therein. The device latches in the transportation position. For the ends to be inserted into the holes in the printed circuit board the device is pushed further onto the cable ends in an operative position. As such, the ends pass in a guided fashion through the holes in the bottom plate portion and into the holes in the printed circuit board.

11 Claims, 4 Drawing Sheets

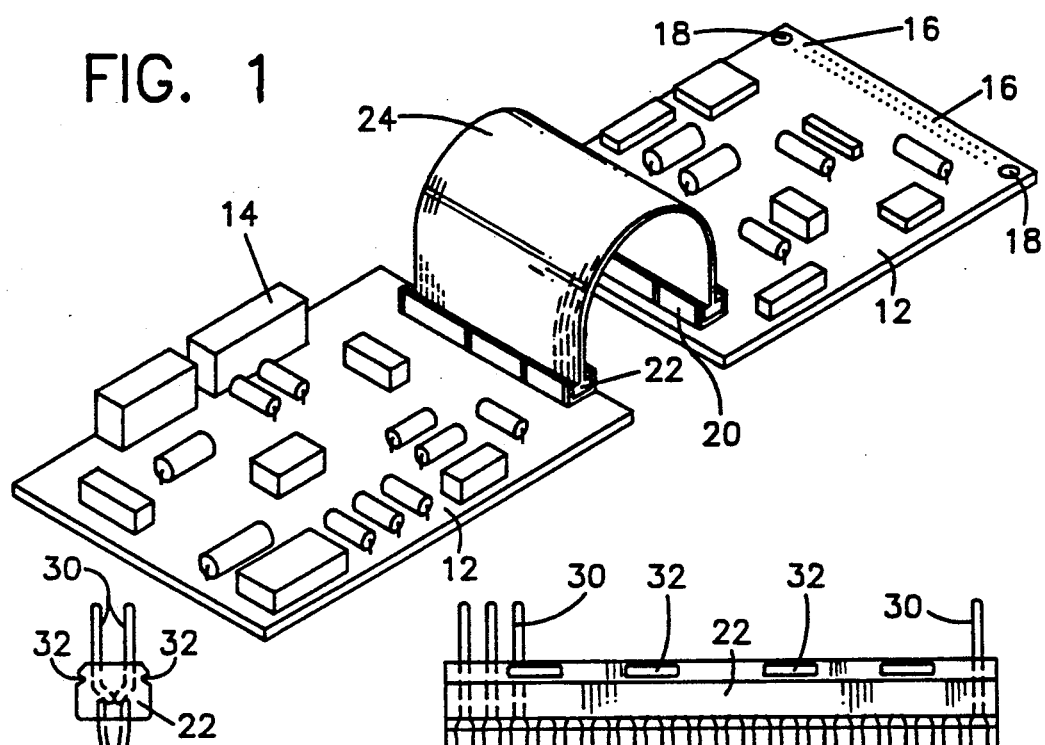
FIG. 1
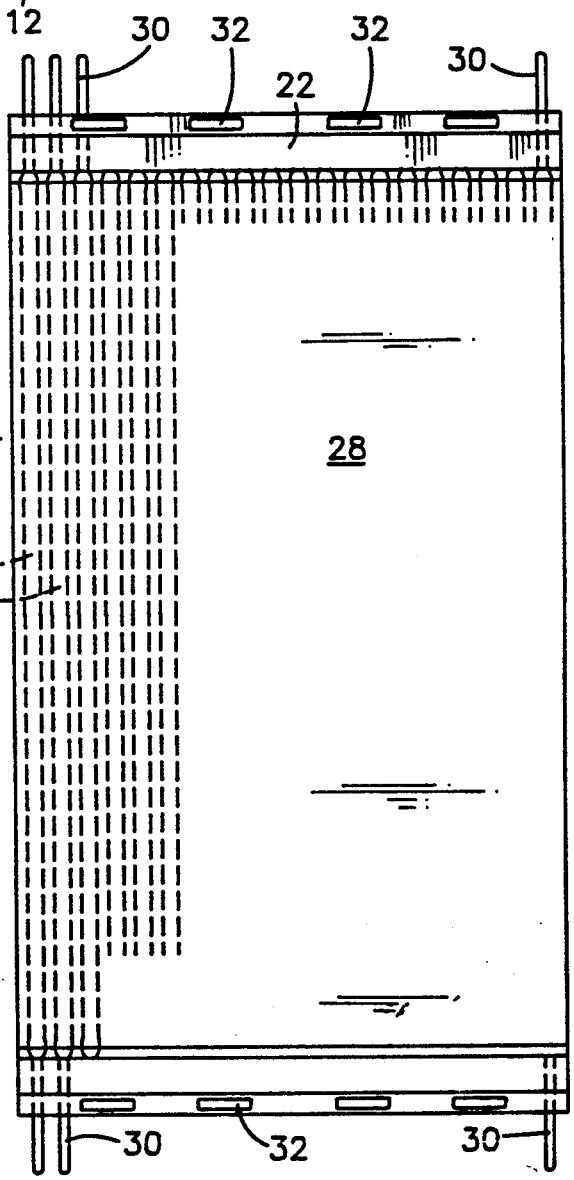
FIG. 2
FIG. 3

TRANSPORTATION PROTECTION AND INSERTION DEVICE FOR MULTI-CONDUCTOR CABLES

FIELD OF THE INVENTION

The invention relates to a device for transportation protection and for insertion of the stripped ends of a flexible multi-conductor connecting cable into the holes in a printed circuit board.

BACKGROUND OF THE INVENTION

Many electrical components include one or more printed circuit boards. At their narrow sides the latter have one or two rows of bores or holes. They are metallized or tin-plated and electrically connected to the conductor traces. They serve for connecting the conductor traces of the printed circuit board to another component or for the connection thereof to the conductor traces of another printed circuit board. Flexible multi-conductor connecting cables are used for a flexible connection of that kind between two printed circuit boards, such cables also being referred to as a jumper or data bus. Short portions of a multi-conductor flat cable are commonly used.

In such a cable, the individual conductors are disposed in side-by-side relationship at equal mutual spacings. The ends of the conductors are stripped of insulation. Insulative bar members may be injection-molded onto those stripped ends, at both ends of the portion of connecting cable. The bar members stabilize the connecting cable portions which generally are only very short. At the same time they stabilize and hold the stripped ends of the conductors in their reference or desired position. The stripped ends project with a portion beyond the bar members. In storage, transportation and also insertion of the stripped ends into the holes in a printed circuit board, such ends may be damaged or even only bent away. That means that the ends can then no longer be easily inserted into the metallized holes at the edge of a printed circuit board.

Guide bar members are sometimes used to facilitate that insertion operation, in the state of the art. The guide bar members are fitted onto the holes at the edge of a printed circuit board, and latched thereto. A guide bar member has a base portion with openings which are aligned with the holes in the printed circuit board. Disposed on the bottom portion are two legs which define a gap between them. The bar member of the connecting cables is pushed into that gap. As such, the stripped ends of the conductors, which project beyond the bar member, are aligned with the openings in the guide bar member and thus the holes in the printed circuit board. In addition, the bar member is guided when it is further inserted into the guide bar member and pushed onto the printed circuit board. However that guidance effect is not successful if the stripped ends of the individual conductors, which project beyond the bar member, were bent during storage, transportation or some handling of the connecting cable.

SUMMARY OF THE INVENTION

Taking the state of the art as its basic starting point, the present invention is based on the design configuration of a device with which the stripped ends of a connecting cable, which project beyond the above-mentioned bar member, are projected during transportation and which additionally facilitates insertion thereof into the holes in a printed circuit board.

The device which is proposed by the invention for solving that problem is distinguished by two legs which may be resiliently pushed onto the sides of the bar member and which can be latched to said sides in different positions, and a bottom plate portion connecting the lower ends of the legs, with openings for the stripped ends to pass therethrough. The device according to the invention is therefore approximately in the form of a U. The device is pushed with its two legs onto the two sides of the bar member. The device can be locked or latched to the bar member in two positions, a transportation position and an operative position. In the transportation position the bottom plate portion is disposed at a spacing from the free ends of the stripped ends of the individual conductors. In that way the free ends are completely enclosed by the two legs and the bottom plate portion of the device according to the invention. The free ends cannot come into contact with anything and therefore they also cannot be bent. In the operative position the free ends pass through the openings in the bottom plate portion. They can then be inserted into the holes in the printed circuit board.

In regard to the structural configuration of the device according to the invention, it is desirable for latching projections to be provided at the free ends of the legs on the insides thereof and for holding means to be provided on the longitudinal sides of the bar member at mutual spacings, ones of the holding means being in contact with the latching projections when the device is not entirely pushed onto the bar member and the others being in contact therewith when the device is entirely pushed on. That position of those two holding means or the height thereof above the bottom plate portion determines the transportation and operative positions. The stripped ends are held in the bar member in such a way that in the transportation position they are disposed completely within the device and are thus protected, while in the operative position they project beyond the openings in the bottom plate portion and can thus be inserted into the holes in the printed circuit board.

Those holding means which are in contact with the latching projections when the device is not entirely pushed on, and thus in the transportation position, are desirably in the form of recesses in the sides of the bar members. On the other hand those holding means which are in contact with the latching projections when the device is fully pushed on, and is thus in the operative position, are desirably in the form of bevels on the top side of the bar member.

The openings provided in the bottom plate portion are desirably conical, with a diameter which decreases downwardly. When the free ends are inserted into those openings, even conductor ends which may have been bent out of their reference or desired position are then received and centered upon being further pushed in.

The multi-conductor connecting cables—also frequently referred to as connecting cables in this description for the sake of simplicity—are in the form of flat cables. Their stripped ends are arranged in side-by-side relationship in the bar members in two rows or planes. The invention correspondingly provides that the openings in the bottom plate portion of the device are arranged in two parallel rows in juxtaposed relationship and in displaced relationship with each other in the longitudinal direction.

Desirably the device has fitting pins for insertion into fitting openings in the printed circuit board. The fitting pins may be arranged at the sides and/or at the ends of the device. They align the openings in the bottom plate portion of the device with the holes in the printed circuit board. That ensures that the stripped ends of the conductors are accurately inserted into those holes. The fitting pins can also be of such a configuration that they latch the device to the printed circuit board.

BRIEF DESCRIPTION OF THE DRAWINGS

The invention is now further described by way of the example of the embodiments shown in the drawings in which:

FIG. 1 is a perspective view of two printed circuit boards which are fitted with components and connected by a flexible connecting cable.

FIG. 2 is a side view of such a connecting cable,

FIG. 3 is a plan view of such a connecting cable,

DETAILED DESCRIPTION OF THE PREFERRED EMBODIMENTS

Figures 4, 5:
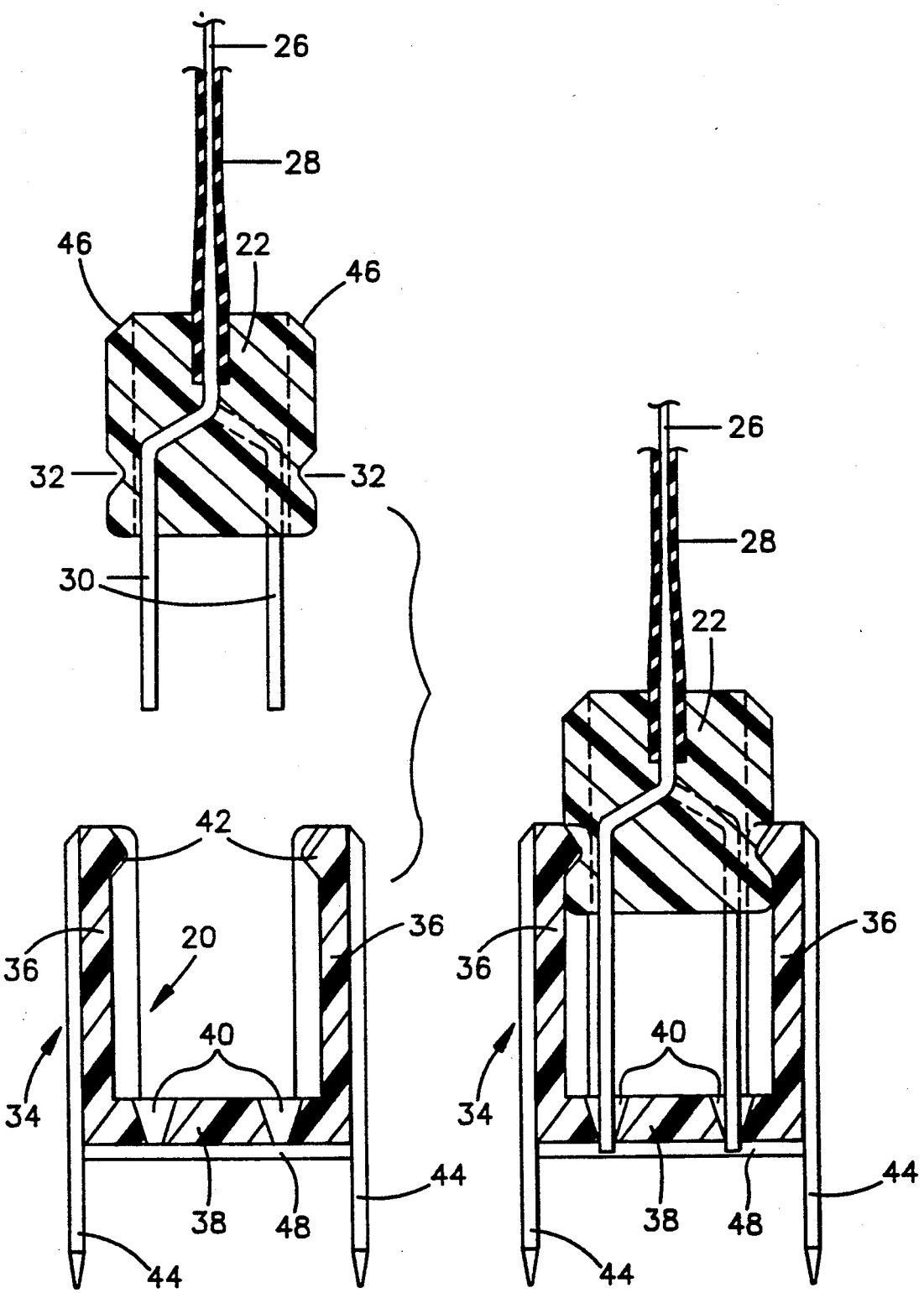
FIG. 4 is a side view of the bar member of a connecting cable and the device according to the invention, partly in section, before the device is pushed onto the bar member or the bar member is pushed into the device.
FIG. 5 is a partly sectional side view of the bar member and the device according to the invention in the transportation position.

FIG. 1 shows two printed circuit boards 12 on which different components 14 are arranged. At their narrow sides the printed circuit boards 12 have two rows of holes 16. The holes 16 are typically tin-plated and are electrically connected to the conductor traces (not shown) on the underside of the printed circuit boards 12. In addition, fitting openings 18 are provided in the corners of the printed circuit boards 12. In order to simplify the view in the drawing, the holes 16 and the fitting openings 18 are illustrated only in the case of one printed circuit board. Guide bar members 20 which are associated with the device according to the invention, are fitted onto the mutually adjacent ends of the two printed circuit boards 12. The bar members 22 which are injection-molded onto the ends of a connecting cable 24 are seated in the guide bar members 20.

FIGS. 2 and 3 show the connecting cable 24 and the individual parts thereof in greater detail. The connecting cable 24 includes the individual conductors 26. They are disposed in a sheathing 28. The ends of the conductors 24 project beyond the sheathing 28, are stripped of insulation and are identified by reference numeral 30. The bar members 22 are injection-molded onto them at both ends.

Figure 6:
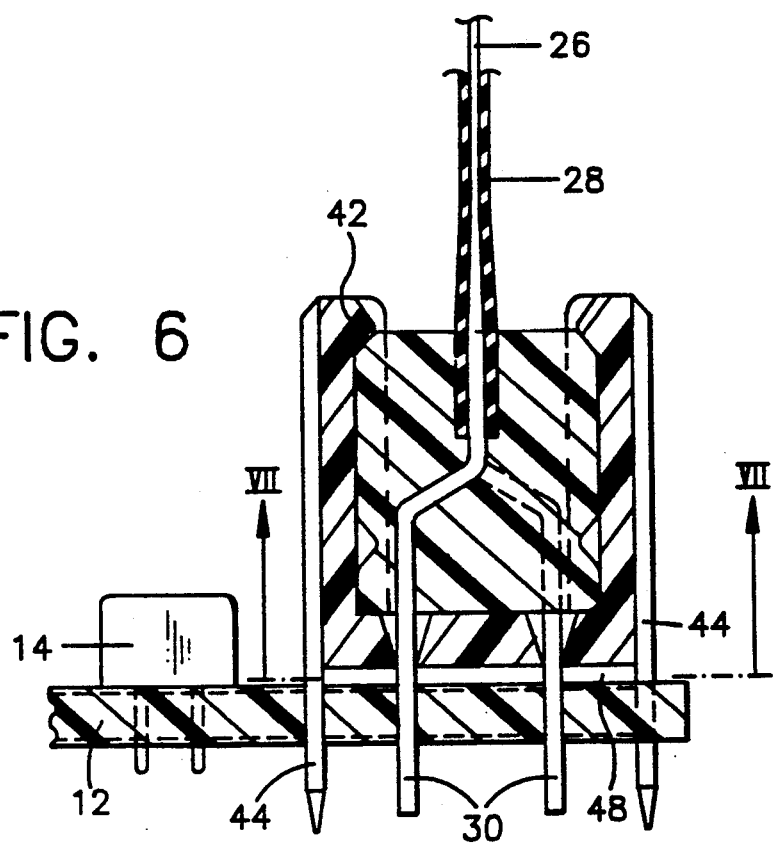
FIG. 6 is a side view of the bar member and the device according to the invention in the operative position while at the same time showing a printed circuit board and the ends of the conductors, which are passed through the holes therein.
Figure 7:
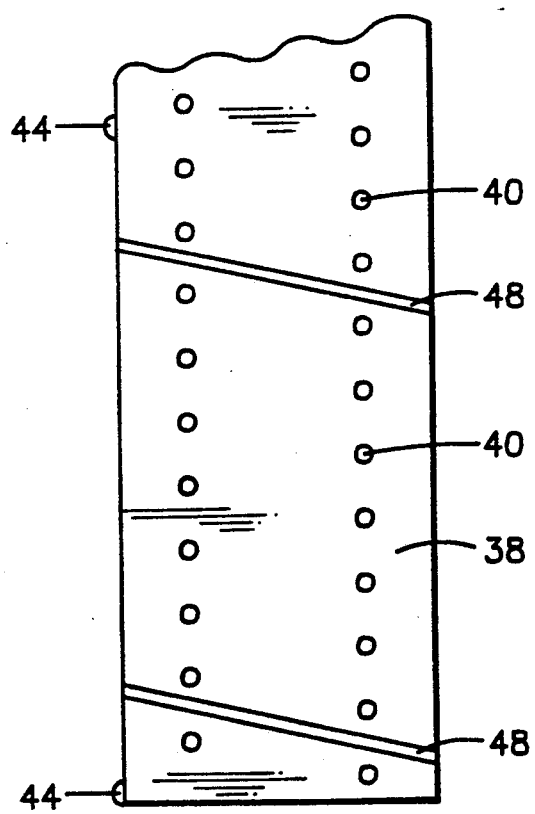
FIG. 7 is a view of the underside of the device, viewing in the direction indicated by the line VII—VII in FIG. 6.
Figures 8, 9, 10:
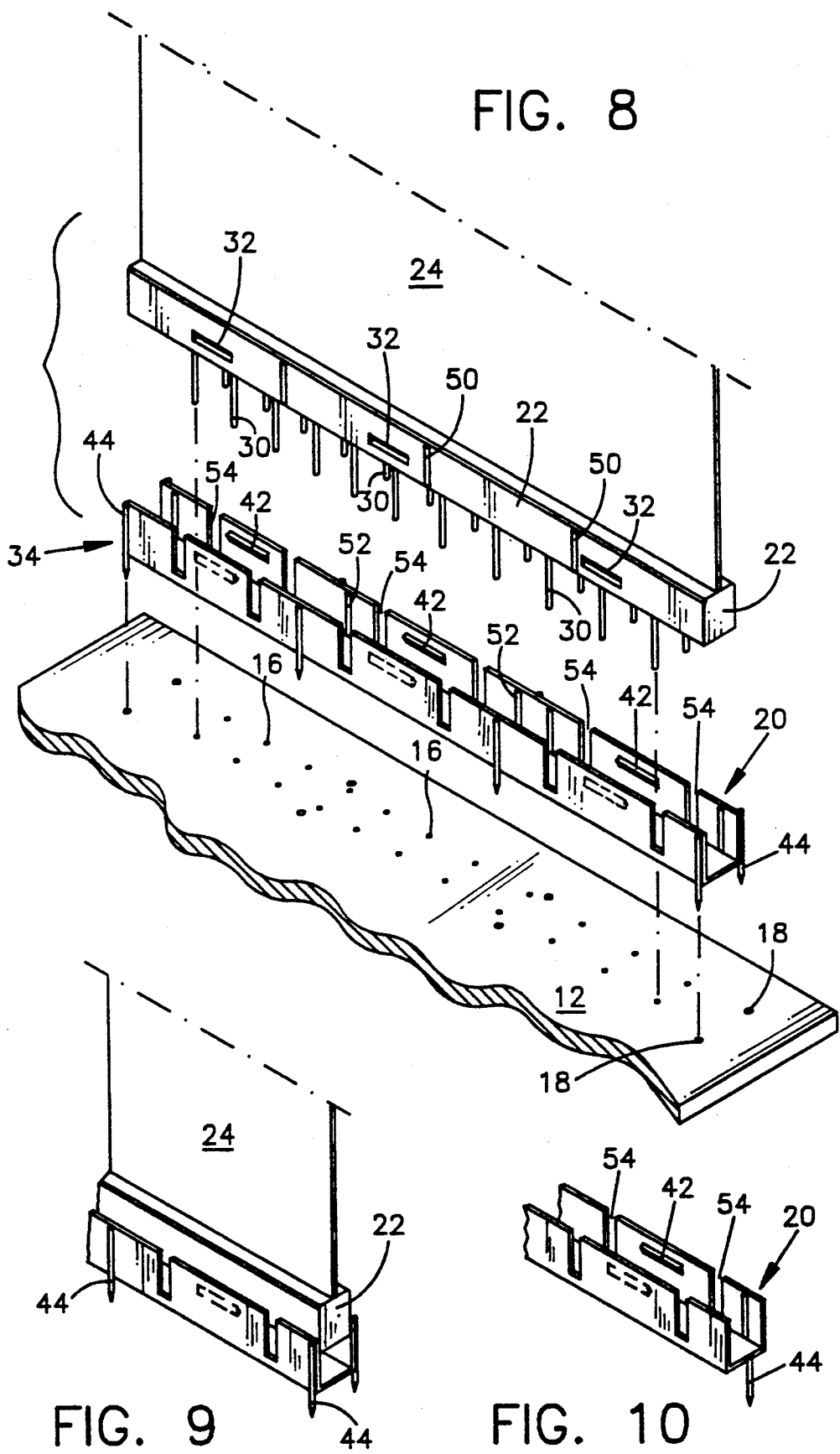
FIG. 8 is a perspective view on a larger scale of the edge of a printed circuit board, a device according to the invention which is to be fitted thereon, and a bar member with a part of a connecting cable, prior to assembly.
FIG. 9 is a perspective partial view of the device according to the invention and a bar member in the transportation position.
FIG. 10 is a perspective partial view of the device according to the invention with another arrangement of a fitting pin.

FIGS. 4 through 7 show the device 34 according to the invention as a whole. It essentially comprises the two legs 36 and the bottom plate portion 38 connecting them, and contains openings 40. The openings 40 are of a diameter which decreases downwardly. The number and arrangement of the openings 40 correspond to the number and arrangement of the stripped ends 30. As shown in FIG. 4, latching projections 42 are disposed at the insides of the legs 36. For receiving the latching projections 42, the bar member 22 has recesses 32 which are also visible in FIG. 4, and bevels 46 on its top side. The Figures also show the fitting pins 44 which are arranged at the sides or on the legs 36. The fitting pins 44 are pushed into the fitting openings 18 in the printed circuit board 12, in the assembly operation. Inclinedly extending spacers are also provided on the underside of the bottom plate portion 38. The spacers 48 ensure that, after the device 34 has been fitted onto a printed circuit board 12, it does not lie directly thereon but only at a spacing therefrom. FIG. 6 shows that situation. In the tinning operation, the tin can then also run from above into the intermediate spaces between the stripped ends 30 and the holes 16, and into the latter. FIG. 8 also shows guide grooves 50 provided on the outside of the bar member 22. Guide limbs 52 in the guide bar member 20 are disposed opposite the guide grooves 50. When the guide limbs 52 are pushed into the guide grooves 50, the guide bar member 20 and the bar member 22 are aligned with each other. Slots 54 are further provided in the legs 36 of the guide bar member 20, to enhance the elasticity of the legs 36.

FIGS. 9 and 10 further show that the fitting pins 44 may be disposed at the sides and at the ends of the guide bar member 20.

After the foregoing individual description, the mode of operation of the device 34 according to the invention can now be described:

FIG. 4 shows that the bar member 22 with the projecting stripped ends 30 and the device 34 prior to assembly. FIG. 5 shows both parts in the transportation position. To achieve that position, the bar member 22 is pushed into the device 34 until the retaining projections 42 latch into the recesses 32. In that insertion movement, the legs 36 bend resiliently outwardly. The stripped ends 30 of the conductors 22 are disposed with their tips just in the openings 40 of the bottom plate portion 38. The components are in the transportation position. The ends 30 project only slightly or not at all beyond same. As a result they are protected for storage, transportation and the like. They cannot knock together with and be bent by other components. For the purposes of connecting the conductors 26 and the bar member 22, the ends 30 thereof are jointly fitted in the transportation position onto a printed circuit board 12. When that occurs, the fitting pins 44 are moved into a position above the holes 18. In that way the device 34 and the bar member 22 are aligned with respect to the printed circuit board 12. The stripped ends 30 lie precisely above the holes 16 in the printed circuit board 12. After the device 34 has been fitted onto the printed circuit board 12, the bar member 22 is pushed downwardly, and finally lies on the bottom plate portion 38. The latching projections 42 bear against the bevels 46. The stripped ends 30 are disposed in the holes 16 in the printed circuit board 12. FIG. 6 shows that operative position.

FIG. 8 shows the device 34 according to the invention, the bar member 22 with the connecting cable 24 and a printed circuit board 12, prior to assembly. The dash-dotted lines show the way in which the fitting pins 44 are aligned with the fitting openings 18 and the ends 30 of the conductors 26 are aligned with the openings (not visible) in the guide bar member 20 and the holes 16 in the printed circuit board 12. When the bar member 22 is inserted into the guide bar member 20 or the device 34 respectively, the guide limbs 52 thereof engage the guide grooves 50. As a result, the bar member 22, with the stripped ends 30, is aligned with respect to the guide bar member 20.

Having described the preferred embodiments herein it should be appreciated that variations thereof may be made thereto without departing from the contemplated scope of the invention. As such, the preferred embodiments are illustrative rather than limiting. The true scope of the invention is set forth in the claims appended hereto.

I claim:

1. An assembly including a flexible multi-conductor connecting cable having a bar member attached at one end thereof, stripped ends of conductors extending through said bar member and being supported thereby in spaced relation, and a device movably attached to said bar member for transportation protection and for insertion of said stripped ends of said conductors into holes in a printed circuit board, said device comprising two legs (36) resiliently received on opposing sides of said bar member (22), latching means (42) for latching said legs to said sides in different positions, and a bottom plate portion (38) connecting said legs (36), said plate portion (38) having openings (40) receiving said stripped ends (30) in a transportation position of said device on said bar member and passing said stripped ends therethrough for insertion into holes of said printed circuit board in an operative position of said device on said bar member.

2. An assembly according to claim 1 wherein said openings (40) are of a conical configuration, with a diameter which decreases downwardly, away from said bar member.

3. An assembly according to claim 1 wherein said openings (40) are arranged in two parallel rows in juxtaposed relationship and in displaced relationship with each other in the longitudinal direction.

4. An assembly according to claim 1 wherein said device includes fitting pins (44) for insertion into fitting openings (18) in said printed circuit board (12).

5. An assembly according to claim 1 wherein said latching means comprises projections (42) provided at free ends of the legs (36) on the insides thereof, and wherein said bar member comprises holding means provided on the sides of said bar member (22) at mutual spacings, ones of said holding means being in contact with the latching projections when the device (34) is in the transportation position on said bar member and others being in contact with said latching projections when the device (34) is in the operative position on said bar member.

6. An assembly according to claim 5 wherein said holding means which are in contact with the latching projections (42) when the device (34) is in the transportation position are recesses (32) in longitudinal sides of the bar member (22).

7. An assembly device according to claim 5 wherein said holding means which are in contact with the latching projections (42) when the device is in the operative position are bevels (46) on the top side of the bar member (22).

8. A device for transportation protection and for insertion of stripped ends of a flexible multi-conductor connecting cable into holes in a printed circuit board, wherein the stripped ends are held in at least one plane at predetermined spacings in a bar member, said device being movably attachable to said bar member and comprising two spaced legs (36) which are to be resiliently pushed onto opposing sides of said bar member (22) and which include latching means (42) for latching said legs to said sides in different positions, said device including a bottom plate portion (38) connecting said legs (36), said plate portion (38) having openings (40) for receipt of said stripped conductor ends (30) and for permitting said stripped ends (30) to pass through for subsequent insertion into holes of said printed circuit board.

9. A device according to claim 8 wherein said latching means comprises projections (42) which are provided at free ends of the legs (36) on the insides thereof.

10. A device according to claim 8 wherein said openings (40) are of a conical configuration, with a diameter which decreases in a direction opposite said legs.

11. A device according to claim 8 further including projecting fitting pins (44) for insertion into fitting openings (18) in said printed circuit board (12).

* * * * *